(12) United States Patent
Kitamura

(10) Patent No.: US 7,886,955 B2
(45) Date of Patent: Feb. 15, 2011

(54) SOLDER BALL MOUNTING DEVICE

(75) Inventor: Yoji Kitamura, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/263,754

(22) Filed: Nov. 3, 2008

(65) Prior Publication Data
US 2009/0120996 A1   May 14, 2009

Related U.S. Application Data

(60) Provisional application No. 60/984,932, filed on Nov. 2, 2007.

(51) Int. Cl.
*B23K 37/00* (2006.01)
(52) U.S. Cl. .......................... 228/41; 228/45
(58) Field of Classification Search ................. None
See application file for complete search history.

(56) References Cited

U.S. PATENT DOCUMENTS

| | | | |
|---|---|---|---|
| 5,626,277 A * | 5/1997 | Kawada | 228/41 |
| 6,003,753 A * | 12/1999 | Hwang et al. | 228/41 |
| 6,279,816 B1 * | 8/2001 | Nakajima et al. | 228/246 |
| 6,352,189 B1 * | 3/2002 | Kobayashi | 228/8 |
| 6,412,685 B2 * | 7/2002 | Hertz et al. | 228/246 |
| 6,638,785 B2 * | 10/2003 | Shiozawa et al. | 438/51 |
| 7,506,792 B1 * | 3/2009 | Manfroy et al. | 228/41 |
| 2003/0042287 A1 * | 3/2003 | Inoue | 228/49.5 |
| 2003/0121957 A1 * | 7/2003 | Cobbley et al. | 228/245 |
| 2004/0094601 A1 * | 5/2004 | Hazeyama et al. | 228/41 |
| 2006/0157540 A1 * | 7/2006 | Sumita et al. | 228/180.22 |
| 2006/0169743 A1 * | 8/2006 | Ng et al. | 228/39 |
| 2007/0251089 A1 * | 11/2007 | Kawamura et al. | 29/874 |

FOREIGN PATENT DOCUMENTS

JP       04074433 A   *   3/1992

(Continued)

OTHER PUBLICATIONS

Derwent-Acc-No: 2007-840288 which corresponds to KR-2006133282A.*

*Primary Examiner*—Kiley Stoner
(74) *Attorney, Agent, or Firm*—Oblon, Spivak, McClelland, Maier & Neustadt, L.L.P.

(57) ABSTRACT

A solder ball mounting device that can mount minute solder balls with a diameter of 200 μm or less onto a connection pad. The solder ball mounting device can mount solder balls to be solder bumps on a printed circuit board using a mask having a plurality of openings corresponding to electrodes of a printed circuit board. The device includes a cylindrical member, which is positioned above the mask for arraying solder balls, for gathering solder balls immediately below the openings by sucking in air from the openings. A movement mechanism is for moving the cylindrical member horizontally relative to the mask for arraying solder balls, wherein solder balls gathered on the mask for arraying solder balls are moved by moving the cylindrical member and are then dropped on electrodes of the printed circuit board via openings of the mask for arraying solder balls. A current plate is placed within the cylindrical member, wherein at least a part of the current plate is positioned in an inner space formed by inner walls of the cylindrical member.

19 Claims, 12 Drawing Sheets

FOREIGN PATENT DOCUMENTS

| | | | | |
|---|---|---|---|---|
| JP | 10242630 A | * | 9/1998 | |
| JP | 11243103 A | * | 9/1999 | |
| JP | 2001044624 A | * | 2/2001 | |
| JP | 2001053428 A | * | 2/2001 | |
| JP | 2003249600 A | * | 9/2003 | |
| JP | 2006-73999 | | 3/2006 | |

* cited by examiner (A)

(B)

(A)

(B)

(A)

(B)

(A)

(B)

(C)

(A)

(B)

(C)

(D)

SOLDER BALL MOUNTING DEVICE

RELATED APPLICATIONS

The present application claims the benefit of U.S. Provisional Application Ser. No. 60/984,932, filed Nov. 2, 2007, the entire content of which is incorporated herein by reference.

TECHNICAL FIELD

The present invention relates to a solder ball mounting device for mounting solder balls to be solder bumps on a printed circuit board.

BACKGROUND ART

Solder bumps are used for electrical connection between package substrates and IC chips. Solder bumps are generally formed in the following processes:

(1) A process to print flux on a connection pad formed on a package substrate.

(2) A process to mount solder balls on a connection pad, on which flux was printed.

(3) A process to reflow to form solder bumps from solder balls.

In the process to mount solder balls mentioned above on a connection pad, a mask for arraying balls, which has an opening in the opposite position to the connection pad, is mounted on a printed circuit board, and solder balls are dropped on the connection pad using squeegees. However, with a method using squeegees, when solder balls have smaller diameters than sand grains with a diameter of 200 μm, the quality of the printed circuit board is lowered because of the variation in height of solder bumps.

Therefore, the inventor, in Japanese published unexamined application No. 2006-73999, suggested a solder ball mounting device for mounting solder balls, wherein a cylindrical member for sucking in air is used to gather air below the cylindrical member by negative pressure, the cylindrical member is moved to send solder balls to a mask for arraying balls and to drop them on a connection pad below an opening of the mask for arraying balls. The entire content of this application is incorporated herein by reference.

SUMMARY OF EMBODIMENTS OF INVENTION

One aspect of the invention includes a solder ball mounting device for mounting solder balls to be solder bumps on a printed circuit board. The device includes a mask for arraying solder balls, comprising a plurality of openings corresponding to electrodes of a printed circuit board; a cylindrical member, which is positioned above the mask for arraying solder balls, for gathering solder balls immediately below the openings by sucking in air from the openings; a movement mechanism for moving the cylindrical member horizontally relative to said mask for arraying solder balls, wherein solder balls gathered on said mask for arraying solder balls are moved by moving the cylindrical member and are then dropped on electrodes of the printed circuit board via openings of the mask for arraying solder balls; and a current plate placed within said cylindrical member, wherein at least a part of the current plate is positioned in an inner space formed by inner walls of the cylindrical member.

BRIEF DESCRIPTION OF DRAWING

FIG. 1(A) is a configuration diagram that shows constitution of the solder ball mounting device according to the present invention and FIG. 1(B) is an arrow view in which the solder ball mounting device in FIG. 1(A) is seen from Arrow B.

FIG. 2(A) is an illustrative drawing of positioning of the multilayer-printed circuit board and FIG. 2(B) is an illustrative drawing of supply of solder balls to the mounting cylinder.

FIG. 3(A) is an illustrative drawing of the mounting cylinder gathering solder balls and FIG. 3(B) is an illustrative drawing of the mounting cylinder gathering and guiding solder balls.

FIG. 4(A) is an illustrative drawing of solder balls dropping to the connection pad and FIG. B(B) is an illustrative drawing of removal of solder balls using the cylinder for removing adsorbed ball.

FIG. 5(A), FIG. 5(B), and FIG. 5(C) are illustrative drawings of manufacturing process of the multilayer-printed circuit board.

FIG. 9(A) is a longitudinal sectional view of the mounting cylinder in Embodiment 1 and FIG. 9(B) is a cross-sectional view of the mounting cylinder related to the alteration example in Embodiment 1.

FIG. 10(A) is a bottom view of the mounting cylinder in Embodiment 2, FIG. 10(B) is a bottom view of the mounting device related to Alteration example 1 of Embodiment 2, and FIG. 10(C) is a bottom view of the mounting device related to Alteration example 2 of Embodiment 2.

FIG. 11(A), FIG. 11(B), FIG. 11(C), and FIG. 11(D) are bottom views of the mounting cylinder in Embodiment 3.

FIG. 12(A) is a vertical cross-sectional view of the mounting cylinder in Embodiment 4 and FIG. 12(B) is its bottom view.

DETAILED DESCRIPTION OF EMBODIMENTS

Figure 1:
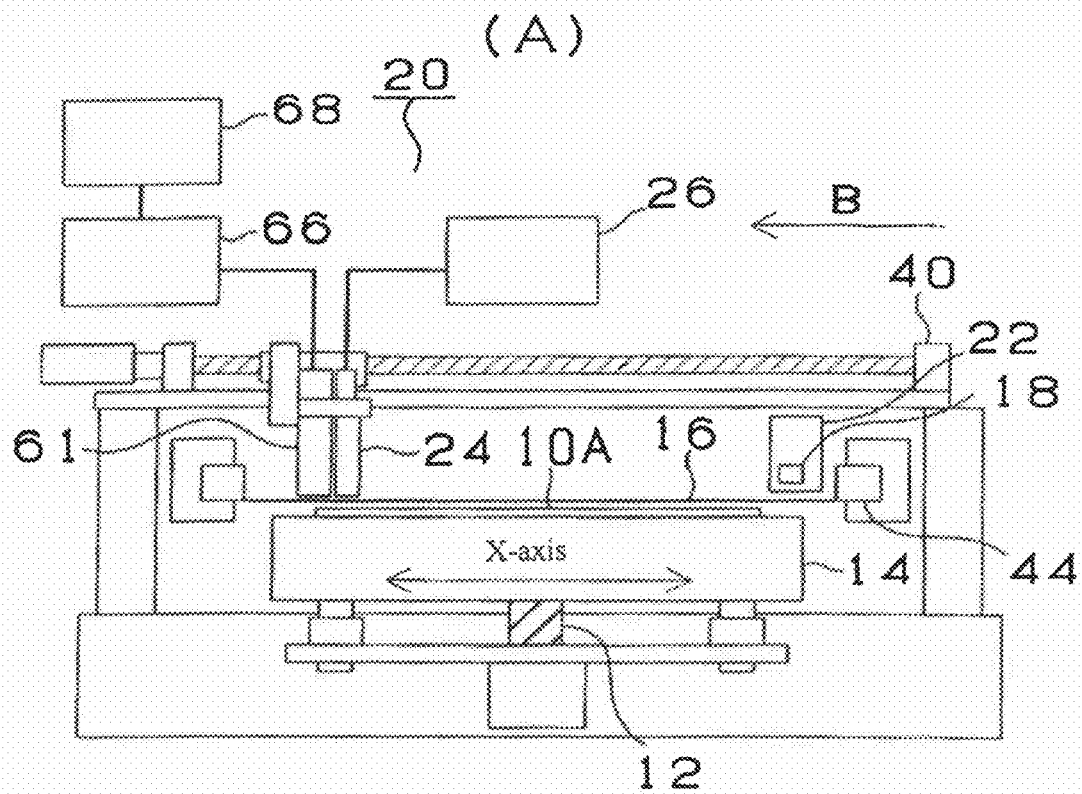
FIG. 1.
Figure 1:
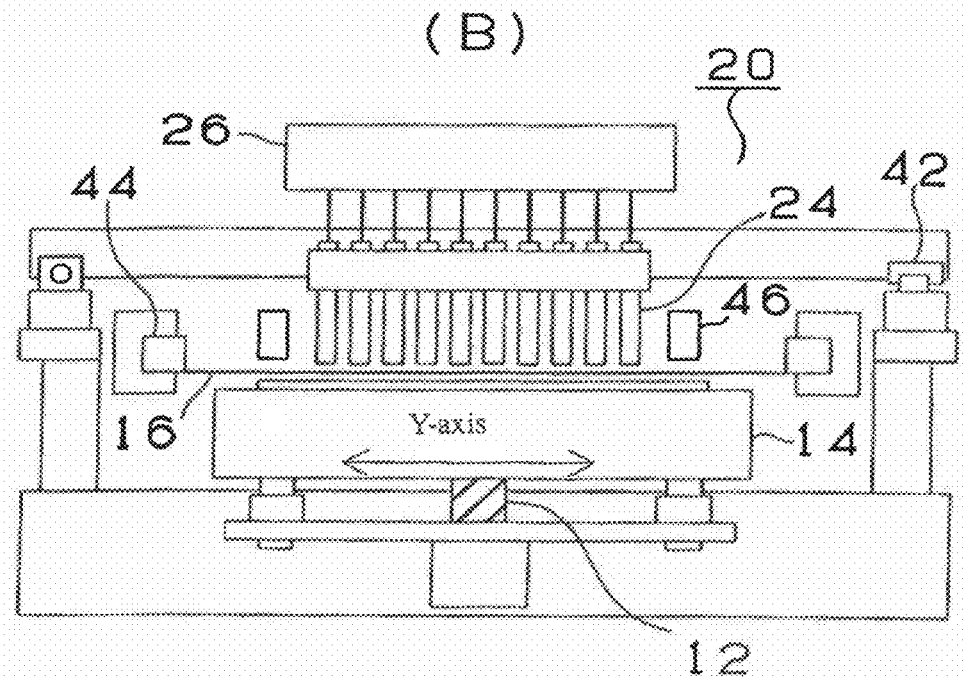

However, even when using the solder ball mounting device according to Japanese published unexamined application No. 2006-73999, sometimes solder balls may not be mounted on connection pads, and therefore, it is difficult to enhance the yield rate of printed circuit boards. As a result of studying the reasons hereof by the inventor, it was found that since clearance between cylindrical members and a mask for arraying balls is narrowed to enhance the speed of airflow so that solder balls with small diameters can be guided, a turbulent airflow occurs in the cylindrical member, and, in the process, solder balls soar in parts where the airflow is fast, the soared solder balls drop and collide against solder balls temporarily mounted on a connection pad, and the solder balls are expelled resulting in being unmounted on the connection pad. It was also revealed that solder balls involved in a turbulent airflow collide against solder balls on the connection pad and become attached there, and, therefore, a plurality of solder balls are placed on the connection pad, and the height of solder bumps becomes high at the time of reflow on the said connection pad.

Thus, one purpose of the present invention is to provide a solder ball mounting device for mounting solder balls with a diameter of less than 200 μm on a connection pad with certainty.

In order to address the purpose above, one embodiment of the invention is a solder ball mounting device for mounting the solder balls to be solder bumps on electrodes of a printed circuit board. The device includes a mask for arraying balls including a plural of openings corresponding to electrodes of a printed circuit board, and a cylindrical member, which is positioned above the mask for arraying balls, for gathering solder balls immediately below the openings by sucking in air from the openings. A movement mechanism is for moving said cylindrical member horizontally to said mask for arraying balls, wherein solder balls gathered on said mask for arraying balls are moved by moving said cylindrical member, solder balls are then dropped on electrodes of the printed circuit board via openings of the mask for arraying balls. A current plate is placed within said cylindrical member, at least a part of the current plate is positioned in the inner space formed by inner walls of said cylindrical member.

According to the solder ball mounting device described above, a cylindrical member is positioned above a mask for arraying balls, air is sucked in from an opening part of said cylindrical member so as to gather solder balls, the cylindrical member is moved horizontally so as to move gathered solder balls on the mask for arraying balls, and solder balls are dropped on a connection pad of a printed circuit board via openings of the mask for arraying balls. Therefore, minute solder balls can be dropped on all connection pads of a printed circuit board with certainty. Furthermore, in order to move solder balls without contact, unlike the case of using squeegees, solder balls can be mounted on connection pads without scratching them, and the height of solder bumps can be even. Moreover, solder balls can be mounted properly on connection pads of even printed circuit boards, which have many undulations on the surface such as a built-up multilayer circuit board.

Here, since a current plate for rectifying air is placed in the cylindrical member, solder balls can be prevented from soaring due to disturbance of airflow, and therefore, soared solder balls may not drop and expel solder balls mounted on the connection pads, and solder balls can be mounted on the connection pad with certainty. Furthermore, solder balls involved in turbulent airflow can be prevented from colliding against each other and become attaching on solder balls on the connection pad and a plurality of solder balls being placed on the connection pad, and therefore, the height of solder bumps on the connection pad can be even. Moreover, where turbulent airflow does not disturb suction of solder balls, it is possible to keep the flow speed around the bottom opening of the cylindrical member constant. Also, the turbulent airflow can be prevented from making solder balls go out of the solder ball mounting device.

According to the solder ball mounting device of claim 1, the current plate can adjust the airflow inside the cylindrical member in the lengthwise direction of the cylinder to be constant so as to prevent or reduce occurrence of turbulent airflow.

According to the solder ball mounting device of another embodiment, the current plate is placed integrally with the inner walls of the cylindrical member, and therefore, turbulent airflow may not occur in a joint part between the cylindrical member and the current plate.

According to another solder ball mounting device, the current plate is placed separately from the inner walls of the cylindrical member, and therefore, the current plate can be attached on the cylindrical member later to make manufacture easy.

According to still another solder ball mounting device, the current plate is formed into a plate linking the opposite site of the cylindrical member, and therefore, the current plate may not resist airflow significantly and can prevent occurrence of turbulent airflow without enhancing the airflow speed inside the cylindrical member, that is, suction force, so as to keep the flow speed around the bottom openings of the cylindrical member constant.

According to solder ball mounting device of another embodiment, since the current plate is formed so that the width of protrusion does not reach the center of the cylindrical member, and thus the current plate may not resist airflow significantly, and can prevent occurrence of turbulent airflow without enhancing airflow speed inside the cylindrical member, that is, suction force, so as to keep the flow speed around the bottom openings of the cylindrical member constant.

According to still another embodiment of the solder ball mounting device, the current plate is formed into the shape of a cross which crosses at the center of the cylindrical member. Therefore, resistance against airflow can become high relatively, but airflow at the bottom openings of the cylindrical member can be even easily and occurrence of turbulent airflow can be prevented so that solder balls can be gathered evenly below the cylindrical member.

According to the solder ball mounting device of another embodiment, the current plate is formed into grids. Therefore, resistance against airflow can become high, but airflow at the bottom openings of the cylindrical member can be even easily and occurrence of turbulent airflow can be prevented so that solder balls can be gathered evenly below the cylindrical member.

According to another solder ball mounting device, the bottom of the current plate is formed upward separately from the bottom of the cylindrical member. Here, if the bottom of the current plate extends to the bottom of the cylindrical member (opening), turbulent airflow occurs at said opening, but occurrence of turbulent airflow at this opening can be prevented.

According to the solder ball mounting device of another embodiment, since the bottom of the current plate is formed upward separately from the bottom of the cylindrical member by more than $1/40$ to less than $1/20$ of the entire length of said cylindrical member. Thus, occurrence of turbulent airflow at the opening of the cylindrical member can be prevented. Here, if such distance is less than $1/40$, the distance between the bottom of the current plate and the mask becomes significantly small, so there is a high possibility that the mounting rate is reduced due to the rebound of solder balls from the bottom of the current plate. On the other hand, if it is more than $1/20$, the current plate does not function and turbulent airflow occurs around the opening of the cylindrical member.

According to the solder ball mounting device of another embodiment, since the current plate is located on the inner walls of the cylindrical member with length of $1/3$ to $9/10$ of the entire length of said cylindrical member, occurrence of turbulent airflow on the cylindrical member can be prevented. If the current plate is less than $1/3$ of the entire length of the cylindrical member, occurrence of turbulent airflow on the cylindrical member may not be prevented. On the other hand, if it exceeds $9/10$, turbulent airflow occurs at the top of the cylindrical member and also resistance against airflow of the cylindrical member can become high and the flow speed for gathering solder balls needs to be enhanced.

Figure 6:
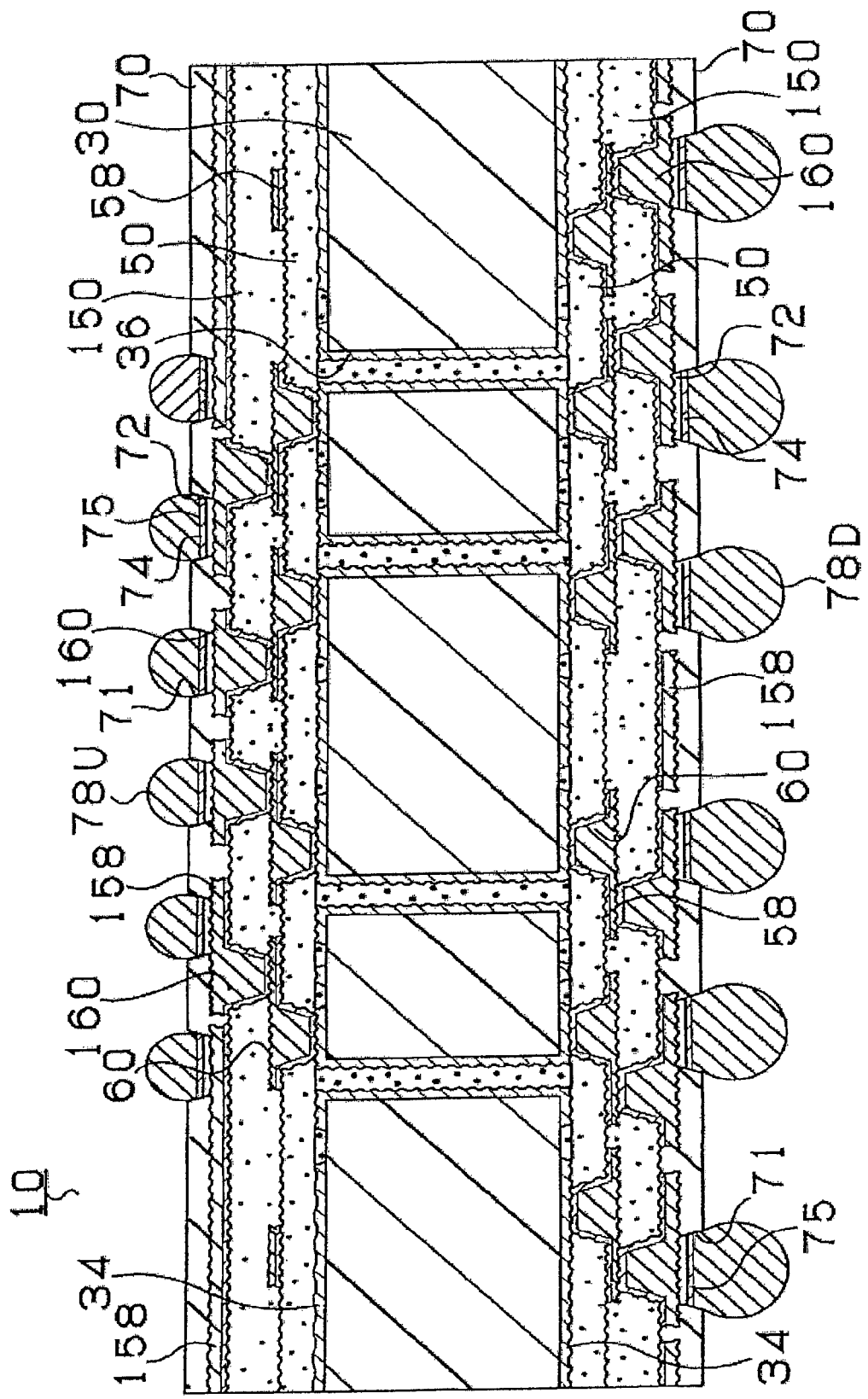
FIG. 6 is a cross-sectional view of the multilayer-printed circuit board.
Figure 7:
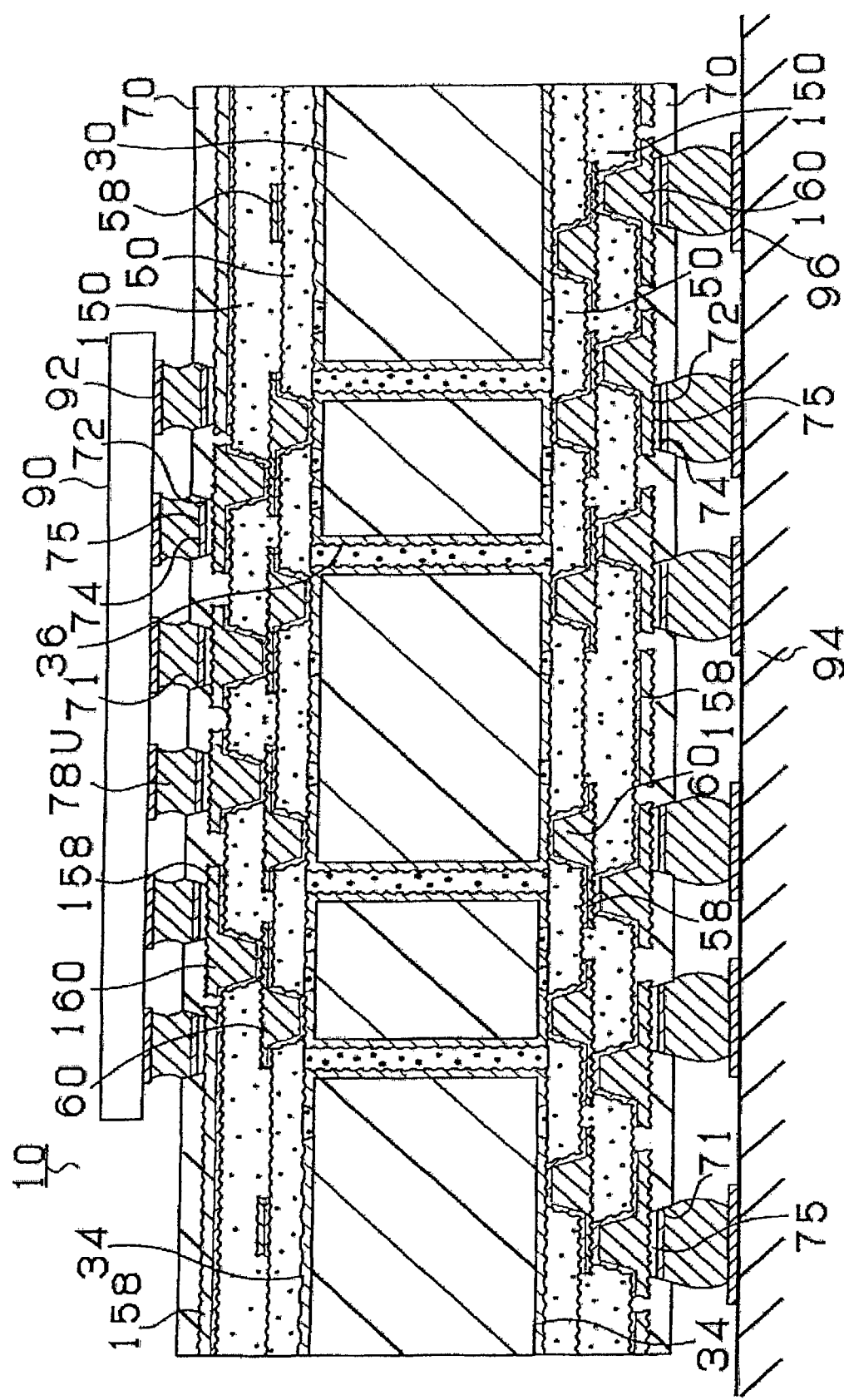
FIG. 7 is a cross-sectional view that shows a state where IC chip is attached on the multilayer-printed circuit board shown in FIG. 6 so as to mount on the daughterboard.

First, constitution of the multilayer-printed circuit board 10 manufactured by using a solder ball mounting device in relation to the present invention is explained by referring to FIG. 6 and FIG. 7. FIG. 6 is a cross-sectional view of said multilayer-printed circuit board 10, and FIG. 7 shows a state where the IC chip 90 is attached on the multilayer-printed circuit board 10 shown in FIG. 6 to be mounted on the daughterboard 94. As shown in FIG. 6, the conductor circuits 34 are formed on both sides of the core substrate 30 on the multilayer-printed circuit board 10. The upper surface and back surface of the core substrate 30 are connected via the through-hole 36.

Furthermore, the conductor circuit 58 for forming a conductor circuit layer is formed via the interlayer resin insulation layer 50 on the conductor circuit 34 of the core substrate 30. The conductor circuit 58 is connected to the conductor circuit 34 via the via-hole 60. The conductor circuit 158 is formed on the conductor circuit 158 via the interlayer resin insulation layer 150. The conductor circuit 158 is connected to the conductor circuit 58 via the via-hole 160 formed on the interlayer resin insulation layer 150.

The solder resist layer 70 is formed on the upper layer of the via-hole 160 and the conductor circuit 158, and the nickel plating layer 72 and the gold plating layer 74 are placed on the opening 71 of said solder resist layer 70 so that the connection pad 75 is formed. The solder bump 78U is formed on the connection pad 75 on the upper surface and the BGA (ball grid array) 78D is formed on the connection pad 75 on the lower surface.

As shown in FIG. 7, the solder bump 78U on the upper surface of the multilayer-printed circuit board 10 is connected to the land 92 of the IC chip 90. On the other hand, BGA 78D on the lower side is connected to the land 96 of the daughterboard 94.

Figure 5:
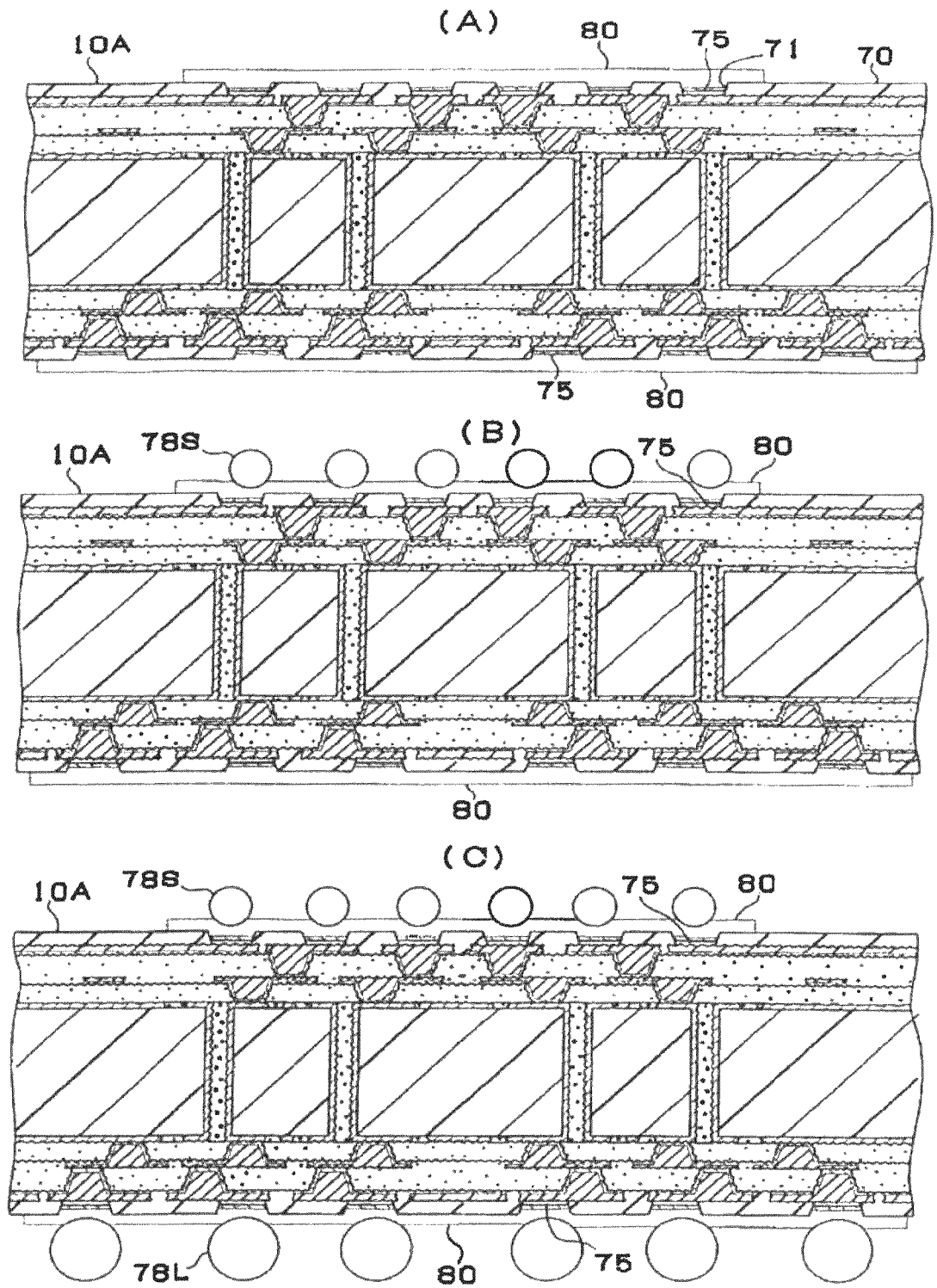
FIG. 5.
Figure 8:
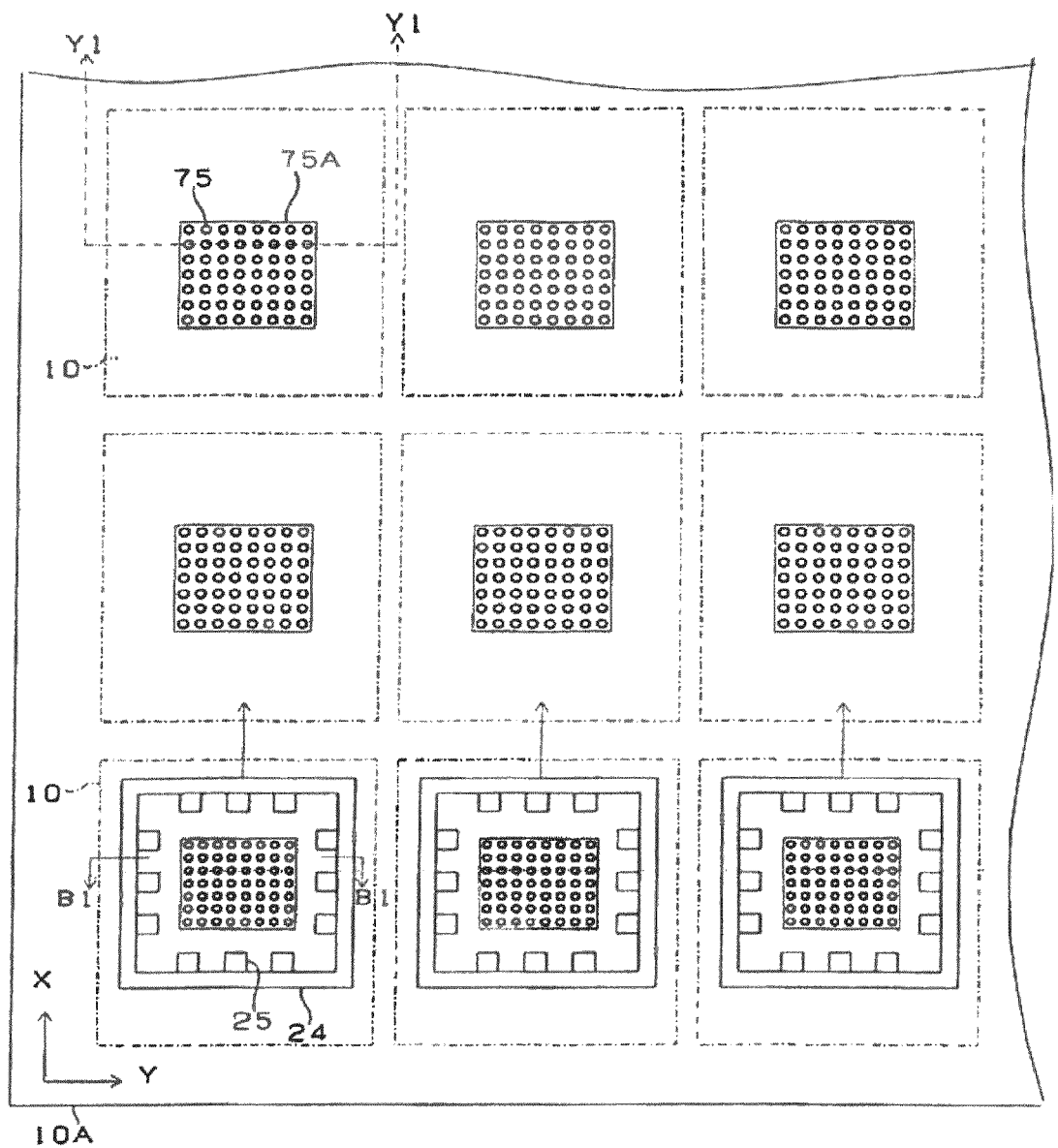
FIG. 8 is a plan view of the multilayer-printed circuit board for multiplicity.

FIG. 8 is a plan view of the multilayer-printed circuit board 10A for multiplicity. The multilayer-printed circuit board 10A cuts individually the multilayer-printed circuit board 10 comprising the connection pad region 75A, in which the connection pad 75 are arrayed in a matrix, by cutting with a dashed line as shown in the drawing. FIG. 5 is an illustrative drawing of a process to form solder bumps on the multilayer-printed circuit board 10A for multiplicity, which corresponds to the Y1-Y1 cross-sectional view in FIG. 8. As shown in FIG. 5(A), the flux 80 is printed on the surface of the formed multilayer-printed circuit board 10A, in which the connection pad 75 is formed on the opening 71 of the solder resist layer 70 on the surface. As shown in FIG. 5(B), minute solder balls 78s (for example, manufactured by Hitachi Metals, Ltd. or TAMURA Corporation, diameter is more than 40 μm and less than 200 μm) are mounted on the connection pad 75 of the upper side of the multilayer-printed circuit board 10A using a solder ball mounting device described below. For response to fine patterning, solder balls with a diameter of less than 200 μm are desirable. Those with a diameter of less than 40 μm do not drop on the connection pad because the solder balls are too light. On the other hand, those with a diameter of greater than 200 μm are too heavy to gather solder balls in the cylindrical member, which results in connection pads being without any solder balls. For the present invention, it is highly meaningful to use solder balls with a diameter of more than 40 μmΦ and less than 200 μmΦ. This range is effective for fine patterning. Additionally, with a method for mounting solder balls on a connection pad by absorbing solder balls using an absorption head, since it is difficult to absorb solder balls because they are small, a solder ball mounting device in the embodiments is clearly advantageous.

Subsequently, as shown in FIG. 5(C), solder balls 78L with a normal diameter (250 μm in diameter) are absorbed to be mounted on the connection pad 75 on the lower side of the multilayer-printed circuit board 10A using an absorption head related to prior art (e.g., Patent 1975429, the entire content of which is incorporated herein by reference). After that, it is heated in a reflow furnace, and, as shown in FIG. 6, solder bumps 78U, e.g., 500-30000, are formed on the upper side of the multilayer-printed circuit board 10A at a pitch of more than 60 μm and less than 200 μm, and BGAs 78D, e.g., 250, are formed on the lower side of that at a pitch of 2 mm. At a pitch of less than 60 μm, it is difficult to manufacture solder balls suitable for that pitch. At a pitch of more than 200 μm, solder balls can be manufactured without any problems by the solder ball mounting device, however, they can also be manufactured using methods in prior art. Furthermore, as shown in FIG. 7, the multilayer-printed circuit board 10A for multiplicity is cut into pieces of the multilayer-printed circuit board 10 and the IC chip 90 is mounted via the solder bump 78U by reflowing, and then the multilayer-printed circuit board 10, on which the IC chip 90 is mounted, is attached to the daughterboard 94 via the BGA 78D.

The solder ball mounting device, on which minute (less than 200 μm in diameter) solder balls 78s on the connection pad of the multilayer-printed circuit board described above by referring to FIG. 5(B), is explained by referring to FIG. 1. FIG. 1(A) is a configuration diagram that shows constitution of solder ball mounting device according to embodiments of the present invention, and FIG. 1(B) is an arrow view of which the solder ball mounting device in FIG. 1(A) is seen from Arrow B.

The solder ball mounting device 20 comprises: the XYθ suction table 14, which positions and holds the multilayer-printed circuit board 10A, the vertical movement axis 12, which moves said XYθ suction table 14 up and down, the mask for arraying balls 16 comprising openings corresponding to the connection pad 75 of the multilayer-printed circuit board, the mounting cylinder (cylindrical member) 24, which guides solder balls moving on the mask for arraying balls 16, the suction box 26, which gives negative pressure to the mounting cylinder 24, the cylinder for removing absorbed ball 61 for collecting excess solder balls, the suction box 66, which gives negative pressure to said cylinder for removing absorbed ball 61, the absorbed ball removal and suction device 68, which holds collected solder balls, the mask lamp 44, which clamps the mask for arraying balls 16, the X-direction movement axis 40, which sends the mounting cylinder 24 and the cylinder for removing absorbed ball 61 to X direction, the supportive guide for movement axis 42, which supports the X-direction movement axis 40, the alignment camera 46, which images the multilayer-printed circuit board 10, the remaining level detection sensor 18, which detects remaining level of solder balls, located below the mounting cylinder 24, and the solder ball supplying device 22, which supplies solder balls to the mounting cylinder 24 based on the remaining level detected by the remaining level detection sensor 18. Only the X-direction movement axis 40, which sends the mounting cylinder 24 and the cylinder for removing absorbed ball 61 into X direction, is shown in the solder ball mounting device 20 as shown in FIG. 1, but it is also possible to comprise a movement mechanism to send it in the Y direction.

In Embodiment 1, the mounting cylinder 24 consists of conductive metal such as SUS stainless, Ni, and Cu, and earthed to the solder ball mounting device 20. Here, when solder balls are sent by moving on the mask for arraying balls 16, even if the solder balls are charged by colliding against each other, the light solder balls with a small diameter are not attached on the mounting cylinder 24 with static electricity and the solder balls can be mounted on a printed circuit board with certainty.

As shown in a plan view in FIG. 8, on the multilayer-printed circuit board for multiplicity 10A, a plurality of the mounting cylinders 24 of the solder ball mounting device 20 are aligned in the Y direction to correspond to individuals of the connection pad regions 75A. Additionally, here, the connection pad region 75A shown with 1 corresponds to the mounting cylinder 24 shown with 1, but the mounting cylinder 24 may correspond to the size of the plurality of connection pad region 75A. Here, Y direction is for descriptive purposes and it may be aligned to X direction. The XYθ suction table 14 positions, absorbs, holds, and corrects the multilayer-printed circuit board 10, on which solder balls are mounted. The alignment camera 46 detects alignment marks on the multilayer-printed circuit board 10 on the XYθ suction table 14 and positions of the multilayer-printed circuit board 10 and the mask for arraying balls 16 based on the positions detected. The remaining level detection sensor 18 detects the remaining level of solder balls using optical methods.

Figure 9:
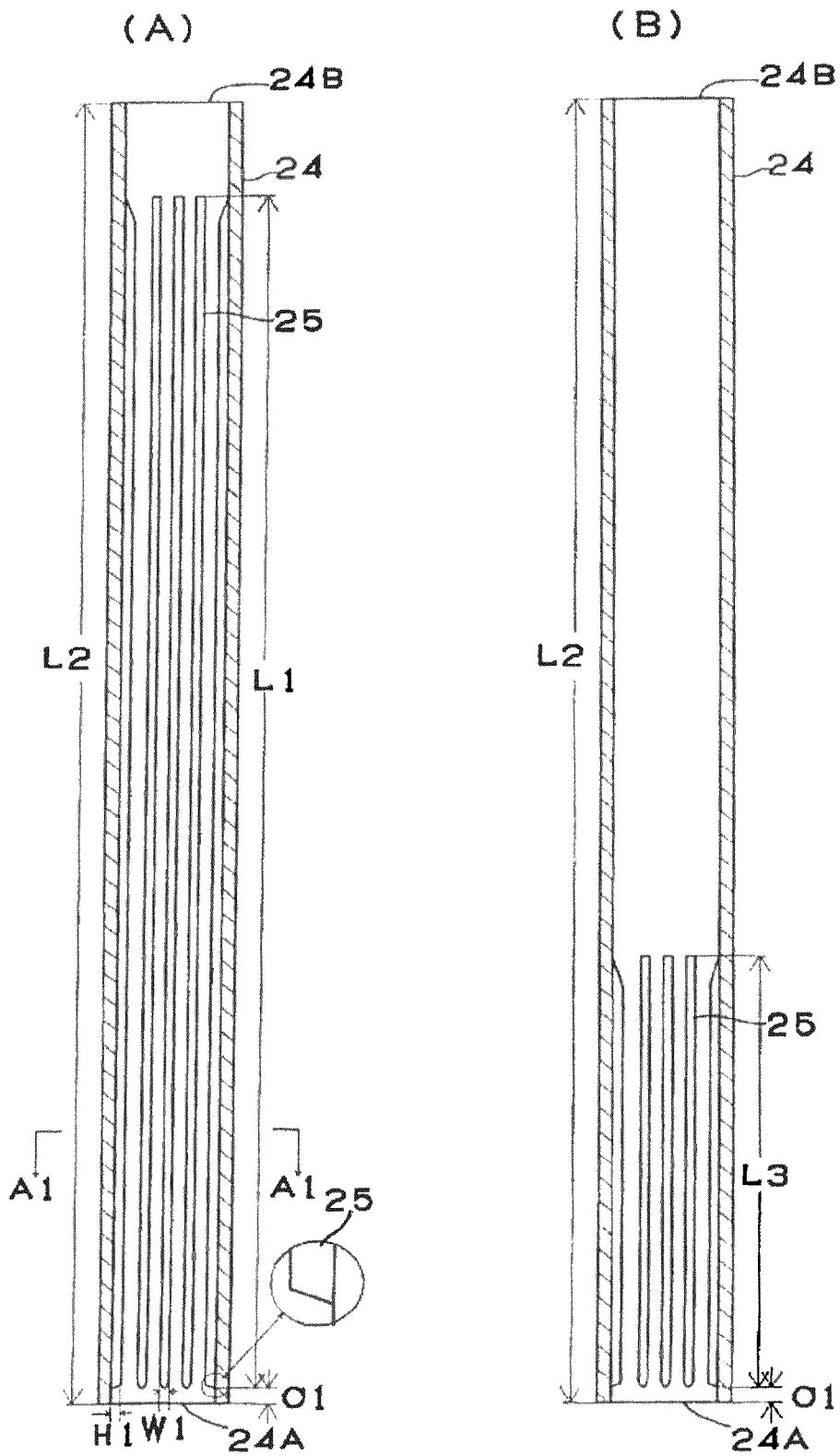
FIG. 9.

FIG. 9(A) shows B1-B1 longitudinal sectional view of the mounting cylinder 24 related to Embodiment 1 in FIG. 8. The mounting cylinder 24 in FIG. 8 corresponds to A1-A1 cross section in FIG. 9(A).

The mounting cylinder 24 in Embodiment 1 is formed with length L2 of, e.g., 200 mm, and the opening part 2424A at the bottom is formed into a square of 24 mm on each side. In Embodiment 1, the opening part 24A is a square, but the mounting cylinder 24 can be rectangular or circular corresponding to the connection pad region 75A to gather solder balls likewise. The current plate 25 is placed along the lengthwise direction of the mounting cylinder 24 in the mounting cylinder 24. The bottom of the current plate 25 with the length L1 (e.g., 170 mm) is placed separately from the opening part 24A at the interval C1 (e.g., 12 mm). The bottom of said current plate 25 is formed into an elliptic cross section made to be round to reduce resistance of airflow, and as shown in the enlarged view, a keel-shaped angle is placed. The current plate 25 is formed to have height H1, e.g., 20 mm and width W1 of 15 mm. This current plate 25 keeps airflow in the mounting cylinder 24 constant, and prevents occurrence of turbulent airflow. FIG. 9(B) shows an alteration example of Embodiment 1. In the alteration example, the current plate 25 is formed to have the length, L3, e.g., 70 mm.

Figure 2:
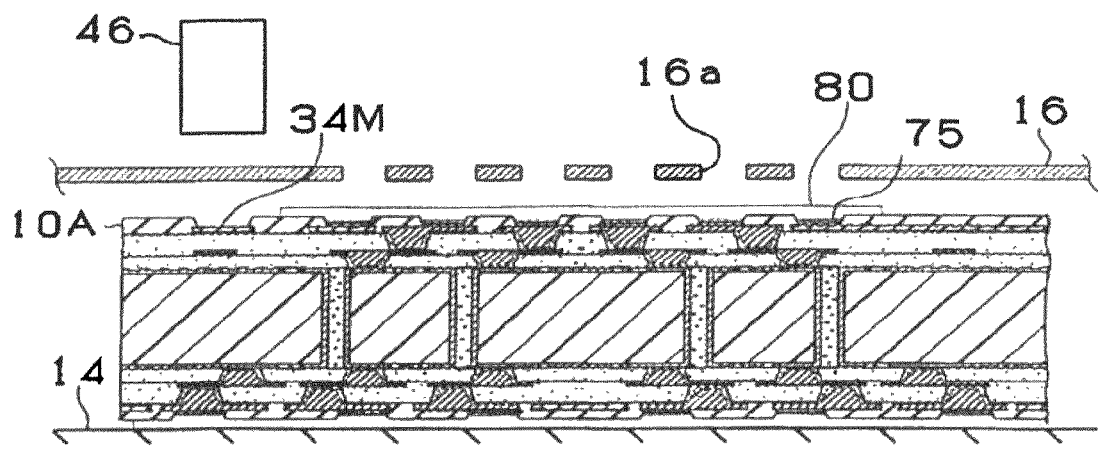
FIG. 2.
Figure 2:
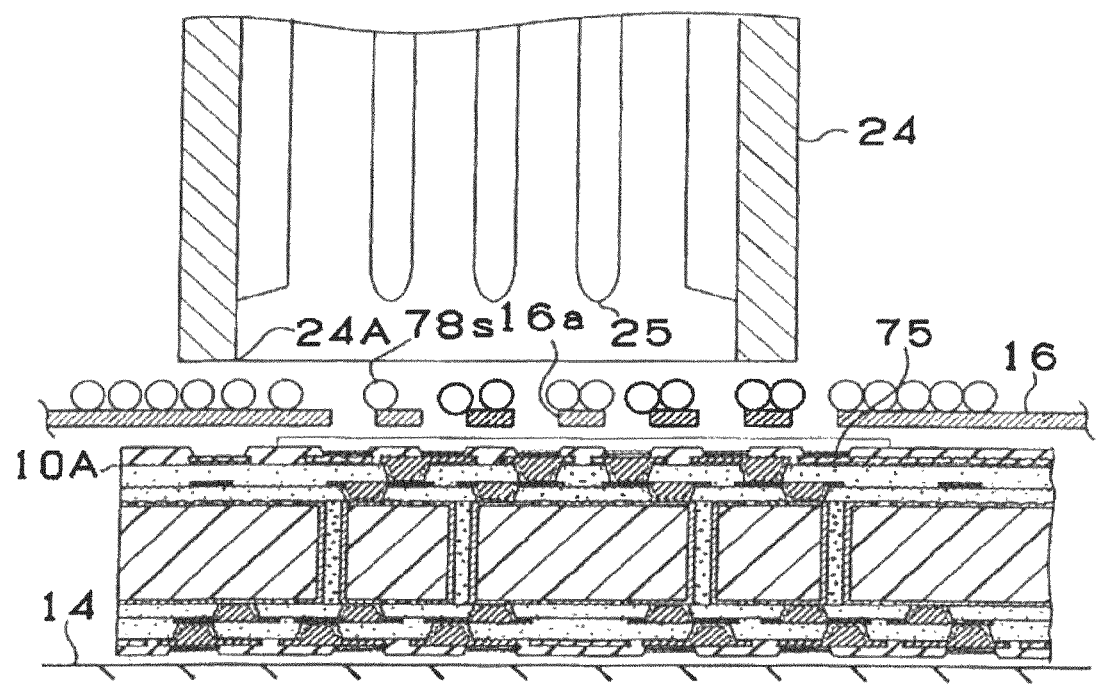
Figure 3:
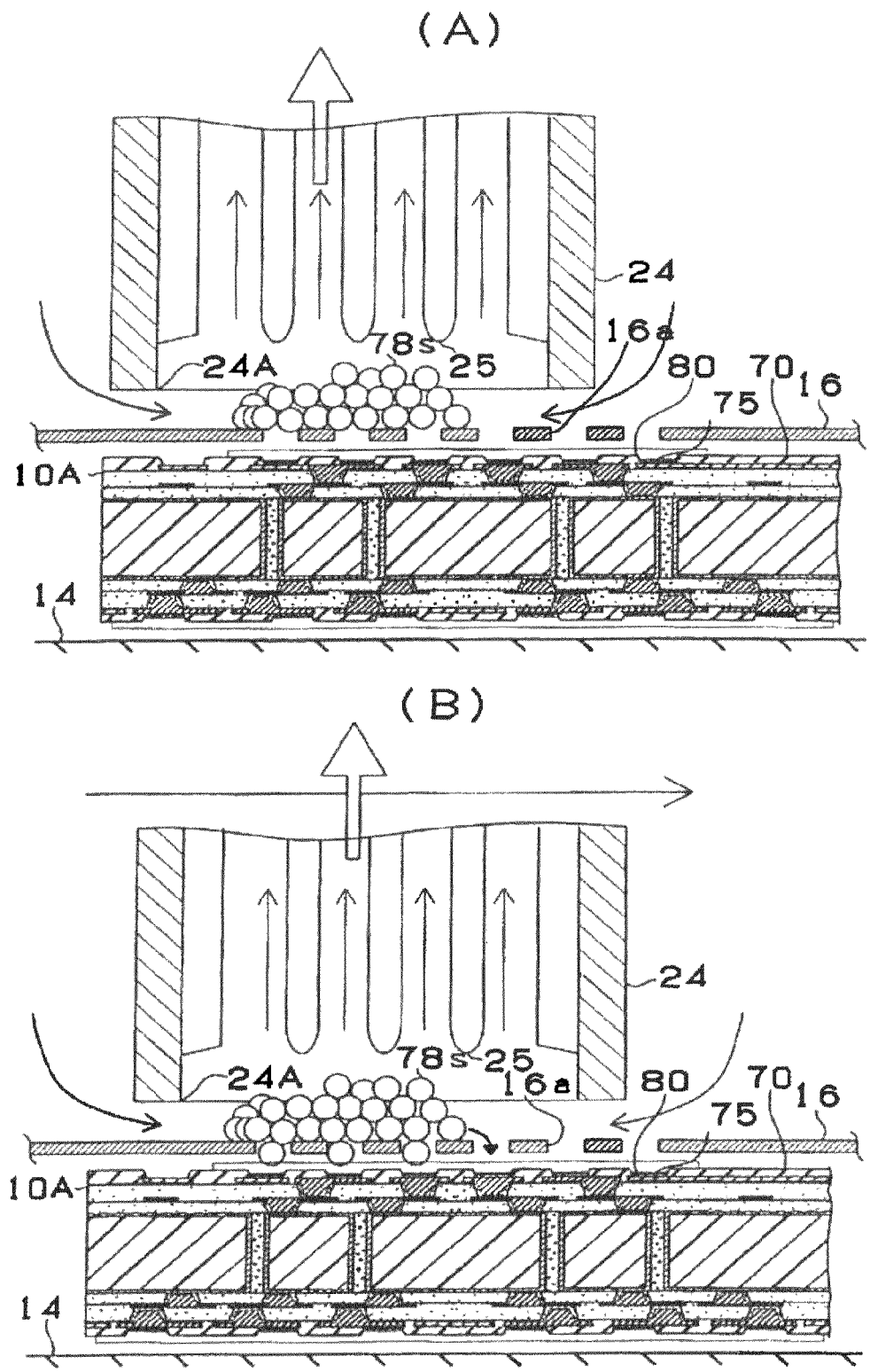
FIG. 3.
Figure 4:
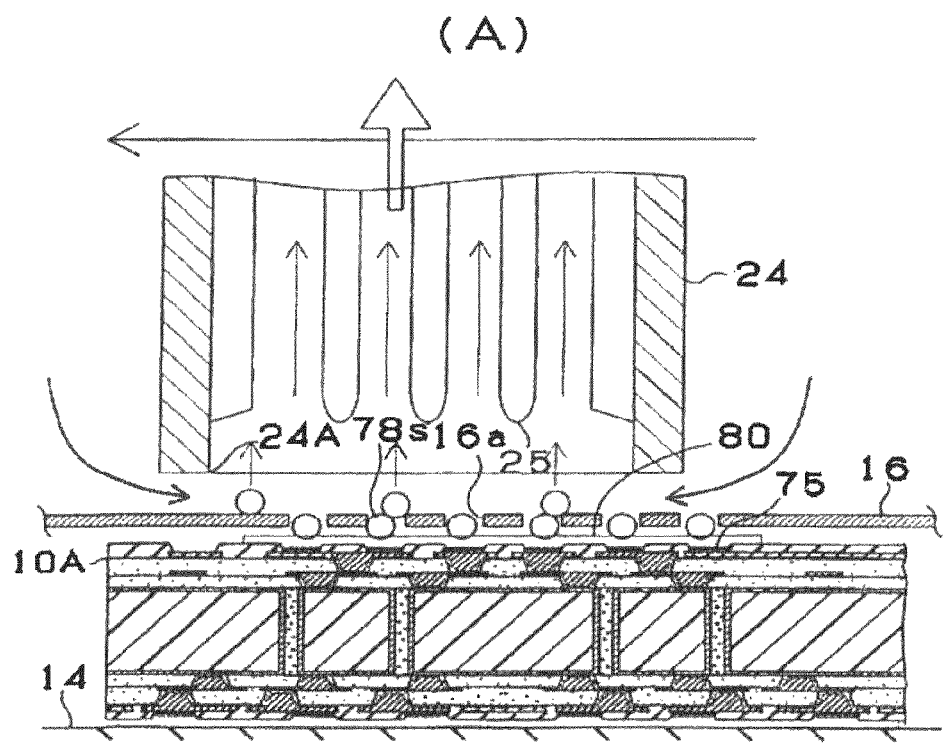
FIG. 4.
Figure 4:
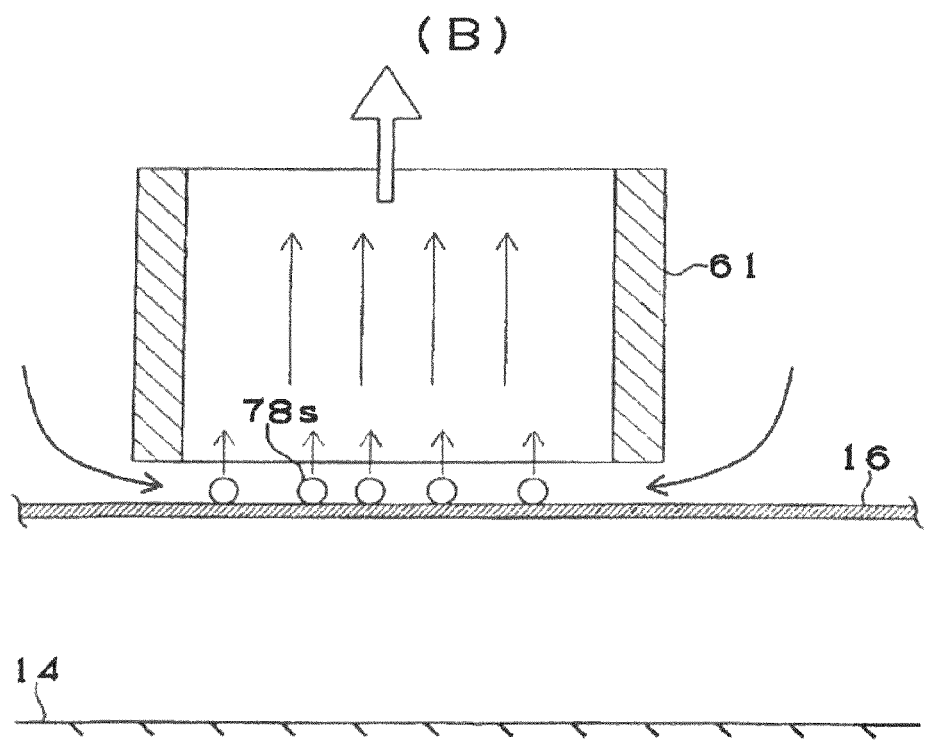

Continuously, the mounting process of solder balls using the solder ball mounting device 20 is explained by referring to FIG. 2-FIG. 4.

(1) Position recognition and correction of multilayer-printed circuit board: As shown in FIG. 2(A), the alignment mark 34 M of the multilayer-printed circuit board for multiplicity 10A is recognized using the alignment camera 46 and the position of the multilayer-printed circuit board 10A for the mask for arraying balls 16 is corrected using the XYθ suction table 14. In other words, the position of the opening 16a of the mask for arraying balls 16 is adjusted to correspond to the connection pad 75 of the multilayer-printed circuit board 10A respectively.

(2) Supplying solder balls: As shown in FIG. 2(B), constant amount of the solder ball 78s is supplied from the solder ball supplying device 22 to the mounting cylinder 24. Additionally, it may be supplied in the mounting cylinder in advance.

(3) Mounting solder balls: As shown in FIG. 3(A), the predetermined clearance (e.g., 0.5-4 times of diameter of a ball) is maintained above the mask for arraying balls 16, the mounting cylinder 24 is positioned, and air is sucked in so as to speed up airflow in the mounting cylinder 0.1 m/sec-2 m/sec, and the flow speed in a gap between the mounting cylinder 24 and the mask for arraying balls 16 is made to be 5 m/sec-35 m/sec so that the solder balls 78s are gathered on the mask for arraying balls 16 immediately below the opening part 24A of said mounting cylinder 24.

Subsequently, as shown in FIG. 3(B), FIG. 4(A), and FIG. 8, the mounting cylinder 24 aligned along Y axis of the multilayer-printed circuit board 10A shown in FIG. 1(B) and FIG. 1(A) is sent in a horizontal direction along X axis via the X-direction movement axis 40. This moves the solder balls 78s gathered on the mask for arraying balls 16 with movement of the mounting cylinder 24, and the solder balls 78s are dropped and mounted on the connection pad 75 of the multilayer-printed circuit board 10A via the opening 16a of the mask for arraying balls 16. This arrays the solder balls 78s on all connection pads on the multilayer-printed circuit board 10A.

(4) Removing attached solder balls: As shown in FIG. 4(B), after the excess of the solder balls 78s is guided to a position without the opening 16a on the mask for arraying balls 16 using the mounting cylinder 24, they are sucked and removed by the cylinder for removing adsorbed ball 61.

(5) Taking a substrate out: The multilayer-printed circuit board 10A is taken out of the XYθ suction table 14.

According to the solder ball mounting device 20 of the present invention, the mounting cylinder 24 is positioned above the mask for arraying balls 16 and air is sucked in using said mounting cylinder 24 so as to gather the solder balls 78s, and the mounting cylinder 24 is moved horizontally so as to move the solder balls 78s gathered on the mask for arraying balls 16 and drop the solder balls 78s on the connection pad 75 of the multilayer-printed circuit board 10A via the opening 16a of the mask for arraying balls 16. Therefore, the solder balls 78s, which are minute, can be mounted on the connection pad 75 of the multilayer-printed circuit board 10A certainly. Furthermore, since the solder balls 78s are moved without contact, unlike the case of using squeegees, solder balls can be mounted on the connection pad 75 without scratching them and the height of the solder bump 78U can be even. Thus, it provides high mountability of electronic parts such as IC and it is superior in environment resistance tests such as heat cycle test and high temperature/high moisture test. Furthermore, since it does not depend on flatness of the products, solder balls can be mounted on connection pads of even printed circuit boards, which have many undulations on the surface. Additionally, since minute solder balls can be mounted on connection pads with certainty, solder bumps, which have stable height on all bumps, can also be made on printed circuit boards, of which the connection pad pitch is at 60-150 μm and the diameter of the openings of solder resist is 40-100 μm.

Furthermore, solder balls are guided with suction force, so aggregation and adhesion of solder balls can be prevented. Moreover, by adjusting the number of the mounting cylinder 24, various size works (multilayer-printed circuit boards of work sheet size) can be dealt with, and therefore, it can be applied flexibly to many kinds of production including small amount of production.

According to the solder ball mounting device in the embodiment, as shown in FIG. 1(B), since a plurality of the mounting cylinder 24 are aligned in the Y direction corresponding to the width of work (multilayer-printed circuit boards of work sheet size), solder balls can be mounted on the connection pad 75 of the multilayer-printed circuit board 10A with certainty only by sending a plurality of the mounting cylinder 24 vertically (X direction) for the line direction.

Furthermore, since the solder balls 78s remaining on the mask for arraying balls 16 can be collected using the cylinder for removing adsorbed ball 61, excessive solder balls remaining will not cause failure such as malfunction.

Here, in Embodiment 1, since the current plate (rectifier) 25 to rectify air is placed in the mounting cylinder 24, the solder balls 78s rarely soar due to disturbance of airflow, and therefore, soared solder balls 78s do not drop and expel solder balls 78s mounted on the connection pads 75, and solder balls 78s can be mounted on the connection pad 75 with certainty. Moreover, it prevents collision of the solder balls 78s with each other. Furthermore, the solder balls 78s involved in the turbulent airflow collide against and become attached on the solder balls 78s on the connection pad 75, and a plurality of the solder balls 78s are not placed on the connection pad 75, and therefore, the height of the solder bump 78U on the connection pad 75 can be even. Additionally, the turbulent airflow does not disturb the suction of the solder ball 78s and the flow speed around the bottom opening part 24A of the mounting cylinder 24 can be kept constant. Also, turbulent airflow does not make solder balls 78s go out of the solder ball mounting device.

The solder ball mounting device in Embodiment 1 consists of a plurality of current plate 25, in which a rectifier is placed in the mounting cylinder 24, so the airflow in the mounting cylinder 24 can be kept constant in the lengthwise direction of the cylinder and occurrence of turbulent airflow can be prevented.

According to the solder ball mounting device in Embodiment 1, since the current plate 25 is formed so that the width of protrusion does not reach the center of the mounting cylinder 24, the current plate 25 is not a major factor in resisting airflow significantly, and it prevents occurrence of turbulent airflow without enhancing airflow speed inside the mounting cylinder 24, that is, suction force, so as to keep the flow speed around the bottom opening part 24A of the mounting cylinder 24 constant.

According to the solder ball mounting device in Embodiment 1, the bottom of the current plate 25 is formed upward separately from the bottom of the mounting cylinder 24. Here, if the bottom of the current plate 25 extends to the bottom of the mounting cylinder 24 (opening part 24A), turbulent airflow occurs at said opening part 24A, but occurrence of turbulent airflow at this opening part 24A can be prevented.

Preferably, the bottom of the current plate 25 is more than 1/40 of the entire length of said mounting cylinder 24 from the bottom of the mounting cylinder 24 and is formed upward separately by less than 1/20 of the interval C1. This can prevent turbulent airflow from occurring at the opening part 24A of the mounting cylinder 24. Here, if the interval C1 is less than 1/40, the distance between the bottom of the current plate and the mask is extremely small, and rebound of solder balls from the bottom of the current plate may highly reduce the mounting rate. On the other hand, if the interval C1 is more than 1/20, the current plate does not function and turbulent airflow occurs around the opening part 24A of the cylindrical member.

Additionally, the length of the current plate 25, L1, is preferably set as 1/3-9/10 of the entire length L2 of the mounting cylinder 24. This can prevent turbulent airflow from occurring at the mounting cylinder 24. If the length L1 of the current plate 25 is less than 1/3 of the entire length L2 of the mounting cylinder 24, this cannot prevent turbulent airflow from occurring at the mounting cylinder 24. On the other hand, if the length L1 exceeds 9/10 of the entire length L2, turbulent airflow occurs at the top of the mounting cylinder 24 and resistance against airflow in the mounting cylinder 24 becomes high, and therefore, the flow speed to gather solder balls 78s needs to be enhanced.

(1) Manufacturing printed circuit boards: Using a double-sided copper clad laminate (e.g., MCL-E-67 manufactured by Hitachi Chemical Co., Ltd.) as a starting material, through-hole conductor and conductor circuit are formed on this substrate with well-known method. Subsequently, using well-known methods (e.g., "Build-up multilayer-printed circuit board" (written by Kiyoshi Takagi) issued by THE NIKKAN KOGYO SHIMBUN, LTD. on Jun. 20, 2000, the entire content of which is incorporated herein by reference), interlayer insulation layers and conductor circuit layers are laminated alternately and a connection pad group is formed to connect IC electrically on the outermost conductor circuit layer. In the connection pad group, 2000 connection pads with a diameter of 120 μm are formed in a connection pad region (70 mm2: 10 mm×7 mm), and most of them are placed in a reticular pattern at a pitch of 150 μm. Here, a connection pad consisting of via-holes (solder bumps are formed immediately above via-holes) preferably consists of filled via-holes, and the amount of concavity and convexity is preferably in a range of −5-5 μm for thickness of a conductor of the conductor circuit 158. If the amount of concavity exceeds 5 μm (−5 μm), contact of the connection pad between solder balls and filled via become small, and therefore, when solder bumps are made, wetness is reduced, voids are involved in solder, and they often cannot be mounted (missing bump). On the other hand, if it exceeds 5 μm, thickness of the conductor circuit 158 increases, and therefore, it is not suitable for fine patterning. Commercial solder resist (20 μm in thickness) is formed on that, and in order to expose the connection pad, openings of 90 μm are formed on the solder resist on the connection pad using photographic method.

(2) Mounting solder balls: Commercial rosin flux is coated on the surface of the printed circuit board manufactured in (1) (surface on which IC is mounted). Subsequently, it is mounted on the suction table of the solder ball mounting device of the present invention described above, alignment marks of the printed circuit board and the mask for arraying balls are recognized using a CCD camera, and the printed circuit board and the mask for arraying balls are positioned. Here, Ni metal mask having openings with a diameter of 110 μm in positions corresponding to the connection pad of the printed circuit board was used as the mask for arraying balls. Thickness of the metal mask is preferably 1/4-3/4 of solder balls. Here, Ni metal mask is used, but SUS and polyimide masks for arraying balls can be used. Additionally, diameter of openings to be formed on the mask for arraying balls is preferably 1.1-1.5 times of diameter of balls used. Next, with size corresponding to the connection pad region (1.1-4 times of the region in which the connection pad is formed), SUS mounting cylinder of 200 mm in height is positioned on the metal mask (mask for arraying balls) with clearance of 0.5-4 times of diameter of solder balls and Sn63Pb37 solder balls (manufactured by Hitachi Metals, Ltd.) with a diameter of balls of 80 μmΦ are placed on the mask for arraying balls around that. In the embodiment, Sn/Pb solder was used for solder ball, but it may be Pb free solder selected from a group of Sn, Ag, Cu, In, Bi, Zn, and so on.

Subsequently, the mounting cylinder is sent at movement speed of 20 mm/sec to move solder balls, and solder balls are dropped from the opening part of the mask for arraying balls so as to mount solder balls on the connection pad. In Embodiment 1, the mounting cylinder 24 consists of conductive metals such as SUS stainless, Ni, and Cu and earthed to the solder ball mounting device 20. Next, after removing excessive solder balls on the mask for arraying balls, the solder mask for arraying balls and the printed circuit board are taken out of the solder ball mounting device separately. Finally, the printed circuit board manufactured above is put in a reflow furnace, which is set to 230 degrees to make a printed circuit board with solder balls.

Figure 10:
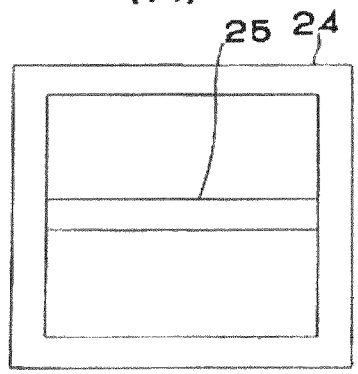
FIG. 10.
Figure 10:
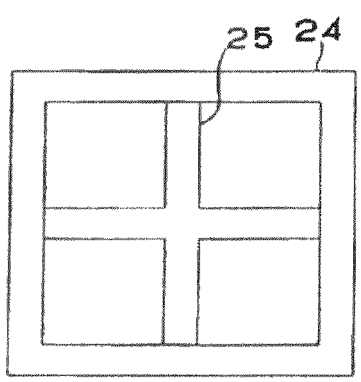
Figure 10:
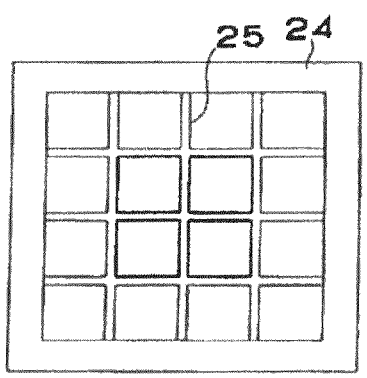
Figure 11:
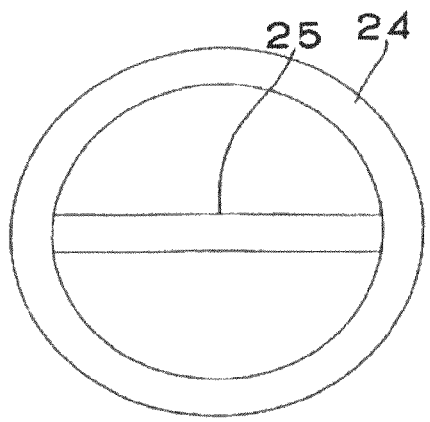
FIG. 11.
Figure 11:
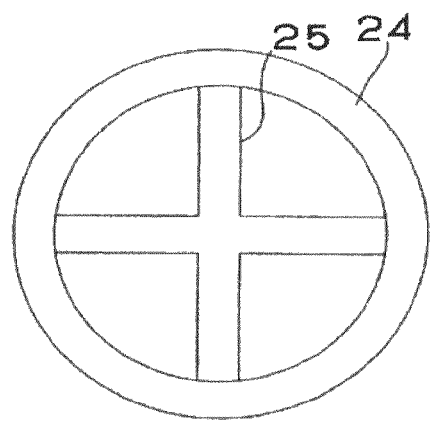
Figure 11:
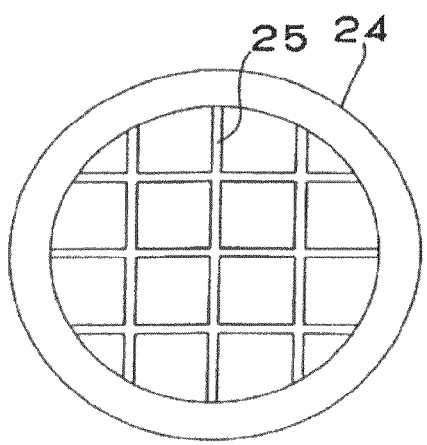
Figure 11:
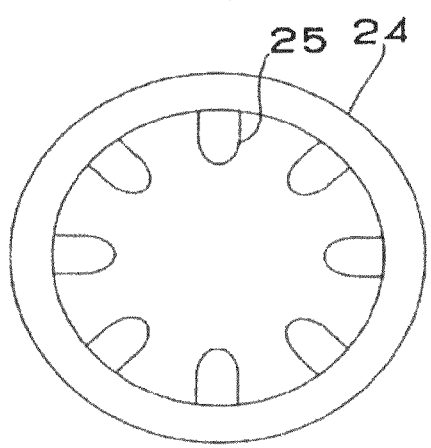

Solder ball mounting device related to Embodiment 2 is explained by referring to a bottom view of the mounting cylinder 24 in FIG. 10(A). As described above by referring to FIG. 8, the current plate 25 is formed so that width of protrusion of it Hi does not reach the center of the mounting cylinder 24 in Embodiment 1. On the other hand, in Embodiment 2, the current plate 25 is formed into one sheet of plate to connect to the opposite site of the cylindrical member 24. Therefore, the current plate 25 does not resist airflow significantly and prevents occurrence of turbulent airflow without enhancing airflow speed inside of the cylindrical member, that is, suction force, so as to keep flow speed around the cylindrical member bottom opening constant.

The solder ball mounting device related to Alteration example 1 of Embodiment 2 is explained by referring to a bottom view of the mounting cylinder 24 in FIG. 10(B). In alteration example 1 of Embodiment 2, the current plate 25 is formed into a cross, which crosses at the center of the mounting cylinder 24. Therefore, resistance against airflow becomes relatively higher than Embodiment 1, but airflow at the bottom opening part 24A of the mounting cylinder 24 can be even easily and occurrence of turbulent airflow is prevented so as to gather solder balls below the mounting cylinder 24 evenly.

The solder ball mounting device related to Alteration example 2 of Embodiment 2 by referring to a bottom view of the mounting cylinder 24 in FIG. 10(C). As described above by referring to FIG. 10(A), in Embodiment 2, the current plate 25 is formed into a cross. On the other hand, in Alteration example 2 of Embodiment 2, the current plate 25 is formed into a grid. Therefore, resistance against airflow becomes high, but airflow at the bottom opening part 24A of the mounting cylinder 24 can be even and occurrence of turbulent airflow is prevented so as to gather solder balls below the mounting cylinder 24 evenly.

The solder ball mounting device related to Embodiment 3 is explained by referring to FIG. 11(A), FIG. 11(B), FIG. 11(C), and FIG. 11(D). In Embodiment 1 and Embodiment 2, the mounting cylinder 24 is formed into a prismatic shape so that the opening part 24A is rectangular. On the other hand, in Embodiment 3, the mounting cylinder 24 is formed so that the opening part is circular. In the example in FIG. 11(A), the current plate 25 is formed into a sheet of plate to connect to the opposite site of the cylindrical member 24. In the example in FIG. 11(B), the current plate 25 is formed into a cross. In the example in FIG. 11(C), the current plate 25 is formed into a grid. In the example in FIG. 11(D), the current plate 25 is formed so that width of protrusion of it does not reach the center of the mounting cylinder 24. With the mounting cylinder 24 in Embodiment 3, occurrence of turbulent airflow inside can be prevented and solder balls are gathered to mount on the connection pad.

Figure 12:
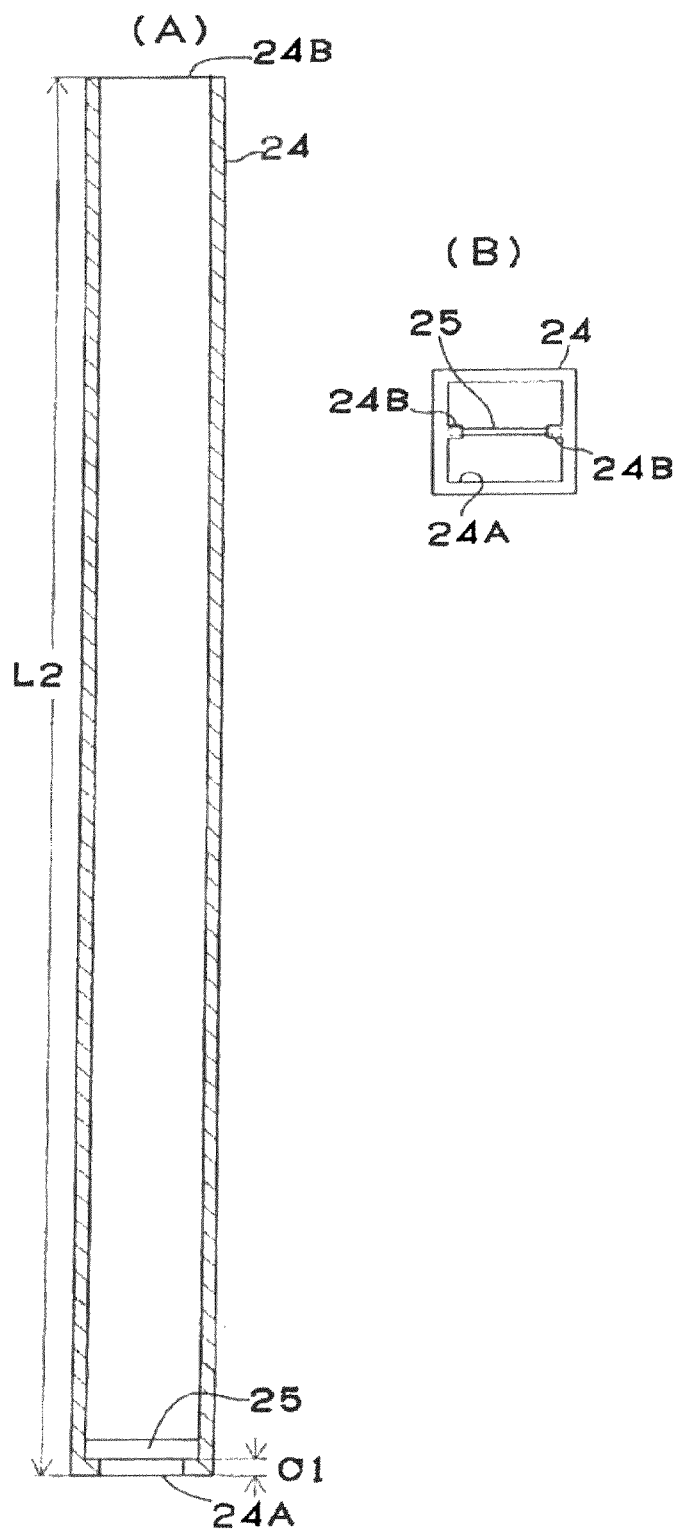
FIG. 12.

FIG. 12(A) is a vertical cross-sectional view of the mounting cylinder of Embodiment 4, FIG. 12(B) is a bottom view. In Embodiment 1-Embodiment 3, the current plate is manufactured integrally with the mounting cylinder. On the other hand, in Embodiment 4, one pair of protrusion sites 24B protruding inside of the bottom of the mounting cylinder 24A is placed and the current plate 25, which is sheet-shaped, is attached above said protrusion sites 24B. In Embodiment 4, the current plate 25 can be attached on the cylindrical member 24 later so it is easy to manufacture it.

The invention claimed is:

1. A solder ball mounting device for mounting solder balls to be solder bumps on a printed circuit board using a mask having a plurality of openings corresponding to electrodes of a printed circuit board, the device comprising:
    a cylindrical member, which is positioned above the mask for arraying solder balls, for gathering solder balls immediately below the openings by sucking in air from the openings;
    a movement mechanism for moving said cylindrical member horizontally relative to said mask for arraying solder balls, wherein solder balls gathered on said mask for arraying solder balls are moved by moving said cylindrical member and are then dropped on electrodes of the printed circuit board via openings of the mask for arraying solder balls; and
    a current plate placed within said cylindrical member, wherein at least a part of said current plate is positioned in an inner space formed by inner walls of the cylindrical member,
    wherein said current plate is formed upward separately from the bottom of the cylindrical member by at least $\frac{1}{40}$ to less than $\frac{1}{20}$ of an entire length of said cylindrical member and formed so that a width of protrusion of the current plate does not reach a center of said cylindrical member.

2. The solder ball mounting device according to claim 1, wherein said current plate is provided integrally with inner walls of said cylindrical member.

3. The solder ball mounting device according to claim 1, wherein said current plate is provided separately from inner walls of said cylindrical member.

4. The solder ball mounting device according to claim 1, wherein said current plate is located on the inner walls of the cylindrical member with a length of $\frac{1}{3}$ to $\frac{9}{10}$ of the entire length of said cylindrical member.

5. A solder ball mounting device for mounting solder balls to be solder bumps on a printed circuit board using a mask having a plurality of openings corresponding to electrodes of a printed circuit board, the device comprising:
    a cylindrical member, which is positioned above the mask for arraying solder balls, for gathering solder balls immediately below the openings by sucking in air from the openings;
    a movement mechanism for moving said cylindrical member horizontally relative to said mask for arraying solder balls, wherein solder balls gathered on said mask for arraying solder balls are moved by moving said cylindrical member and are then dropped on electrodes of the printed circuit board via openings of the mask for arraying solder balls; and
    a current plate placed within said cylindrical member, wherein at least a part of said current plate is positioned in an inner space formed by inner walls of the cylindrical member,
    wherein said current plate is formed into the shape of a cross that crosses at a center of said cylindrical member.

6. The solder ball mounting device according to claim 5, wherein said current plate is formed into grids.

7. The solder ball mounting device according to claim 5, wherein a bottom of said current plate is formed upward separately from a bottom of said cylindrical member.

8. The solder ball mounting device according to claim 7, wherein said current plate is formed upward separately from the bottom of the cylindrical member by at least $\frac{1}{40}$ to less than $\frac{1}{20}$ of an entire length of said cylindrical member.

9. The solder ball mounting device according to claim 5, wherein said current plate is located on the inner walls of the cylindrical member with a length of ⅓ to 9/10 of the entire length of said cylindrical member.

10. The solder ball mounting device according to claim 5, wherein said current plate is formed into a plate linking an opposite side of said cylindrical member.

11. The solder ball mounting device according to claim 6, wherein said current plate is located on the inner walls of the cylindrical member with a length of ⅓ to 9/10 of the entire length of said cylindrical member.

12. The solder ball mounting device according to claim 10, wherein said current plate is located on the inner walls of the cylindrical member with a length of ⅓ to 9/10 of the entire length of said cylindrical member.

13. The solder ball mounting device according to claim 5, wherein said current plate is provided integrally with inner walls of said cylindrical member.

14. The solder ball mounting device according to claim 5, wherein said current plate is provided separately from inner walls of said cylindrical member.

15. The solder ball mounting device according to claim 8, wherein said current plate is located on the inner walls of the cylindrical member with a length of ⅓ to 9/10 of the entire length of said cylindrical member.

16. A solder ball mounting device for mounting solder balls to be solder bumps on a printed circuit board using a mask having a plurality of openings corresponding to electrodes of a printed circuit board, the device comprising:

a cylindrical member, which is positioned above the mask for arraying solder balls, for gathering solder balls immediately below the openings by sucking in air from the openings;

a movement mechanism for moving said cylindrical member horizontally relative to said mask for arraying solder balls, wherein solder balls gathered on said mask for arraying solder balls are moved by moving said cylindrical member and are then dropped on electrodes of the printed circuit board via openings of the mask for arraying solder balls; and a current plate placed within said cylindrical member,
   wherein at least a part of said current plate is positioned in an inner space formed by inner walls of the cylindrical member,
   wherein said current plate is formed so that a width of protrusion of the current plate does not reach a center of said cylindrical member, and
   wherein said current plate is located on the inner walls of the cylindrical member with a length of ⅓ to 9/10 of the entire length of said cylindrical member.

17. The solder ball mounting device according to claim 16, wherein said current plate is formed upward separately from the bottom of the cylindrical member by at least 1/40 to less than 1/20 of an entire length of said cylindrical member.

18. The solder ball mounting device according to claim 16, wherein said current plate is provided integrally with inner walls of said cylindrical member.

19. The solder ball mounting device according to claim 16, wherein said current plate is provided separately from inner walls of said cylindrical member.

* * * * *